US012757790B2

(12) United States Patent
Kim et al.

(10) Patent No.: US 12,757,790 B2
(45) Date of Patent: Oct. 6, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Yeongseon Kim, Suwon-si (KR); Dohyun Kim, Suwon-si (KR); Juhyeon Kim, Suwon-si (KR); Hyoeun Kim, Suwon-si (KR); Seonkyung Seo, Suwon-si (KR); Chajea Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 362 days.

(21) Appl. No.: 18/364,802

(22) Filed: Aug. 3, 2023

(65) Prior Publication Data

US 2024/0055406 A1 Feb. 15, 2024

(30) Foreign Application Priority Data

Aug. 11, 2022 (KR) ........................ 10-2022-0100586

(51) Int. Cl.
*H10W 90/00* (2026.01)
*H10W 72/00* (2026.01)
(Continued)

(52) U.S. Cl.
CPC .......... *H10W 90/00* (2026.01); *H10W 74/111* (2026.01); *H10W 72/019* (2026.01);
(Continued)

(58) Field of Classification Search
CPC ......... H01L 24/05; H01L 24/08; H01L 24/80; H01L 2224/039; H01L 2224/05014;
(Continued)

(56) References Cited

U.S. PATENT DOCUMENTS

| | | | |
|---|---|---|---|
| 8,860,221 | B2 | 10/2014 | Park et al. |
| 9,142,517 | B2 | 9/2015 | Liu et al. |

(Continued)

FOREIGN PATENT DOCUMENTS

| | | | |
|---|---|---|---|
| JP | 5407660 | B2 | 2/2014 |
| KR | 10-2021-0107592 | A | 9/2021 |
| KR | 10-2021-0151569 | A | 12/2021 |

*Primary Examiner* — Mamadou L Diallo
(74) *Attorney, Agent, or Firm* — Wolf, Greenfield & Sacks, P.C.

(57) ABSTRACT

A semiconductor package includes a first semiconductor chip including a first semiconductor device, a second semiconductor chip including a second semiconductor device, and a bonding structure between the first and second semiconductor chips, the bonding structure including a first bonding pad, a first bonding insulating layer, a second bonding pad in contact with the first bonding pad, and a second bonding insulating layer in contact with the first bonding insulating layer. The first bonding pad may include a first pad metal layer and a first conductive barrier layer surrounding the first pad metal layer, and the first conductive barrier layer may include a horizontal extension portion extending on an edge of an upper surface of the first pad metal layer.

20 Claims, 20 Drawing Sheets

(51) Int. Cl.

| | |
|---|---|
| ***H10W 72/90*** | (2026.01) |
| ***H10W 74/10*** | (2026.01) |
| ***H10W 80/00*** | (2026.01) |
| ***H10W 90/20*** | (2026.01) |
| ***H10W 90/26*** | (2026.01) |

(52) U.S. Cl.
CPC .... *H10W 72/01951* (2026.01); *H10W 72/921* (2026.01); *H10W 72/923* (2026.01); *H10W 72/932* (2026.01); *H10W 80/312* (2026.01); *H10W 80/327* (2026.01); *H10W 80/334* (2026.01); *H10W 80/701* (2026.01); *H10W 90/26* (2026.01); *H10W 90/297* (2026.01); *H10W 90/792* (2026.01); *H10W 90/794* (2026.01)

(58) Field of Classification Search
CPC . H01L 2224/05015; H01L 2224/05555; H01L 2224/08121; H01L 2224/08148; H01L 2224/08235; H01L 2224/05013; H01L 2224/0501; H01L 2224/0555; H01L 2224/0805; H01L 2224/08501; H01L 24/07; H01L 2224/08123
See application file for complete search history.

(56) References Cited

U.S. PATENT DOCUMENTS

| | | | | |
|---|---|---|---|---|
| 9,443,802 | B2 | 9/2016 | Kagawa et al. | |
| 9,941,243 | B2 | 4/2018 | Kim et al. | |
| 11,251,157 | B2 | 2/2022 | Yang et al. | |
| 11,257,782 | B2 | 2/2022 | Kanda | |
| 12,198,981 | B2 * | 1/2025 | Katkar | H01L 21/76829 |
| 2014/0117546 | A1 * | 5/2014 | Liu | H01L 25/0657 438/669 |
| 2014/0353828 | A1 * | 12/2014 | Edelstein | H01L 24/03 257/751 |
| 2017/0358553 | A1 * | 12/2017 | Kim | H01L 24/92 |
| 2021/0202382 | A1 * | 7/2021 | Okina | H01L 23/5226 |
| 2021/0320114 | A1 * | 10/2021 | Lee | H01L 23/5386 |
| 2022/0336394 | A1 * | 10/2022 | Ishikawa | H01L 24/06 |
| 2023/0008286 | A1 * | 1/2023 | Hou | H01L 25/50 |
| 2024/0153915 | A1 * | 5/2024 | Lee | H01L 24/05 |

* cited by examiner

SEMICONDUCTOR PACKAGE AND METHOD OF MANUFACTURING THE SAME

CROSS-REFERENCE TO RELATED APPLICATION

This application is based on and claims priority under 35 U.S.C. § 119 to Korean Patent Application No. 10-2022-0100586, filed on Aug. 11, 2022 in the Korean Intellectual Property Office, the disclosure of which is incorporated by reference herein in its entirety.

BACKGROUND

The inventive concept relates to a semiconductor package and a method of manufacturing the semiconductor package, and more particularly, to a semiconductor package having a stacked structure of a plurality of semiconductor chips and a method of manufacturing the semiconductor package.

In order to improve the performance and storage capacity of a semiconductor device, a semiconductor package having a structure in which a plurality of semiconductor chips are stacked may be used. In particular, a method of forming a stacked structure of a plurality of semiconductor chips by bonding a wafer and another wafer to each other through a connection pad and sawing the same has been proposed. However, there is a problem in that, the difficulty of a bonding process increases because in general, dishing of the connection pad including a metal material such as copper occurs.

SUMMARY

The inventive concept provides a semiconductor package capable of preventing defects in a bonding process of a connection pad having a miniaturized footprint.

The inventive concept provides a method of manufacturing a semiconductor package capable of preventing defects in a bonding process of a connection pad having a miniaturized footprint.

According to an aspect of the inventive concept, there is provided a semiconductor package including a first semiconductor chip including a first semiconductor device, a second semiconductor chip including a second semiconductor device, and a bonding structure between the first semiconductor chip and the second semiconductor chip, the bonding structure including a first bonding pad electrically connected to the first semiconductor device, a first bonding insulating layer surrounding a sidewall of the first bonding pad, a second bonding pad electrically connected to the second semiconductor device and in contact with the first bonding pad, and a second bonding insulating layer surrounding a sidewall of the second bonding pad and in contact with the first bonding insulating layer. The first bonding pad may include a first pad metal layer in a first pad opening portion of the first bonding insulating layer and a first conductive barrier layer surrounding a sidewall and a bottom surface of the first pad metal layer and disposed between the first bonding insulating layer and the first pad metal layer, and the first conductive barrier layer may include a horizontal extension portion extending on an edge of an upper surface of the first pad metal layer.

According to another aspect of the inventive concept, there is provided a semiconductor package including a first semiconductor chip including a first semiconductor device, a second semiconductor chip including a second semiconductor device, and a bonding structure between the first semiconductor chip and the second semiconductor chip, the bonding structure including a first bonding insulating layer on the first semiconductor chip, a first bonding pad in a first pad opening portion of the first bonding insulating layer and including a first conductive barrier layer and a first pad metal layer, a second bonding insulating layer on the first semiconductor chip and in contact with the first bonding insulating layer, and a second bonding pad in a second pad opening portion of the second bonding insulating layer and including a second conductive barrier layer and a second pad metal layer, wherein an upper surface of the second pad metal layer is in contact with an upper surface of the first pad metal layer, and a part of the first conductive barrier layer is in contact with the second conductive barrier layer on an outer edge of the upper surface of the first pad metal layer.

According to another aspect of the inventive concept, there is provided a semiconductor package including a first semiconductor chip including a first semiconductor device and a plurality of through electrodes, a second semiconductor chip including a second semiconductor device, a bonding structure between the first semiconductor chip and the second semiconductor chip, the bonding structure including a first bonding insulating layer on the first semiconductor chip, a first bonding pad in a first pad opening portion of the first bonding insulating layer and including a first conductive barrier layer and a first pad metal layer, a second bonding insulating layer on the first semiconductor chip and in contact with the first bonding insulating layer, and a second bonding pad in a second pad opening portion of the second bonding insulating layer and including a second conductive barrier layer and a second pad metal layer, wherein an upper surface of the second pad metal layer is in contact with an upper surface of the first pad metal layer, and a part of the first conductive barrier layer is in contact with the second conductive barrier layer on an edge of the upper surface of the first pad metal layer, a molding layer surrounding a side surface of the first semiconductor chip, and a connection pillar penetrating the molding layer and electrically connected to the second semiconductor chip.

According to another aspect of the inventive concept, there is provided a method of manufacturing a semiconductor package, the method including forming a first bonding insulating layer including a first pad opening portion on a first semiconductor chip, forming a first conductive barrier layer on an inner wall of the first pad opening portion of the first bonding insulating layer, forming a first pad metal layer filling an inside of the first pad opening portion on the first conductive barrier layer, the first pad metal layer including an upper surface at a lower vertical level than an upper surface of the first bonding insulating layer, and removing a part of an upper side of the first bonding insulating layer by a first planarization process so that an upper surface of the first bonding insulating layer is at a same vertical level as the upper surface of the first pad metal layer, and forming a horizontal extension portion of the first conductive barrier layer extending on an edge of the upper surface of the first pad metal layer.

According to another aspect of the inventive concept, there is provided a method of manufacturing a semiconductor package including forming a first bonding insulating layer including a first pad opening portion on a first semiconductor chip, sequentially forming a first conductive barrier layer and a first pad metal layer on an inner wall of the first pad opening portion of the first bonding insulating layer, forming a horizontal extension portion of the first conductive barrier layer extending on an edge of an upper surface of the first pad metal layer, providing a second semiconductor chip including a second bonding insulating layer and a second bonding pad, and bonding the first semiconductor chip and the second semiconductor chip to each other so that the first bonding insulating layer is in contact with the second bonding insulating layer, the upper surface of the first pad metal layer is in contact with an upper surface of the second bonding pad, and at least a part of the horizontal extension portion is in contact with the second bonding pad.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in detail with reference to the accompanying drawings.

Figure 1:
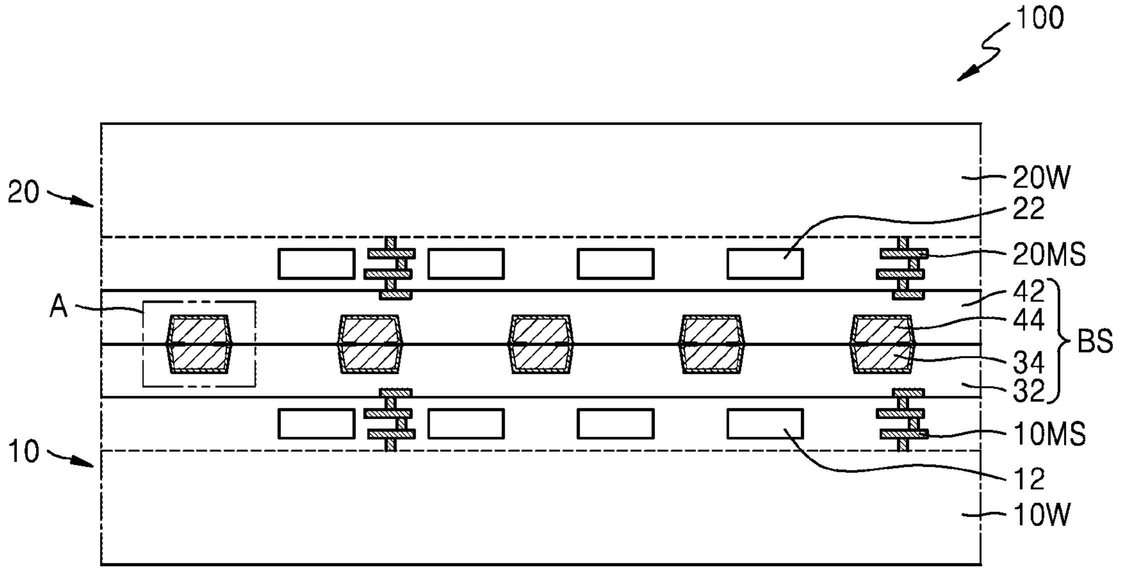
FIG. 1 is a cross-sectional view illustrating a semiconductor package according to some embodiments.
Figure 2:
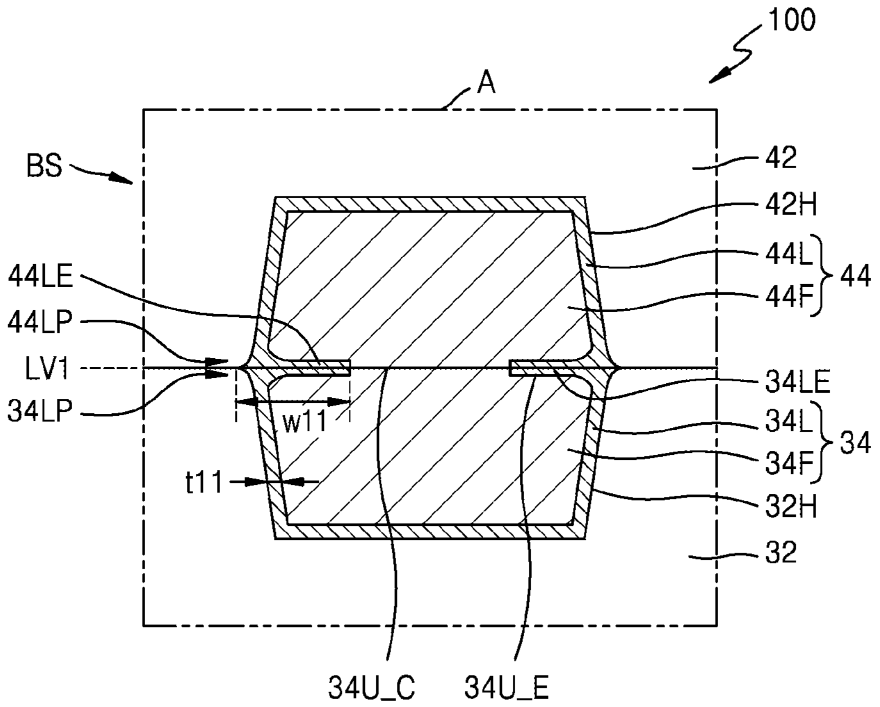
FIG. 2 is an enlarged view of part A of FIG. 1.
Figure 3:
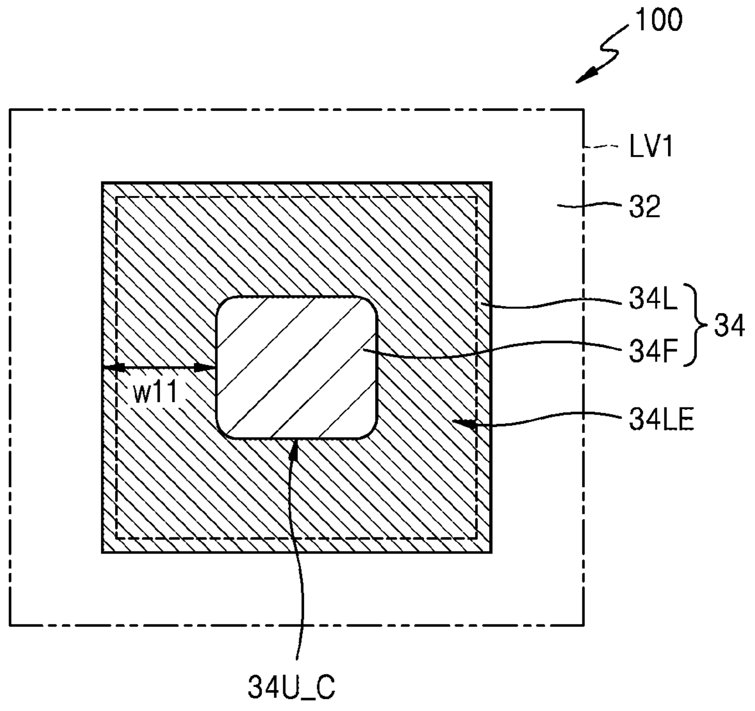
FIGS. 3 to 5 are schematic plan views of a first bonding pad.
Figure 4:
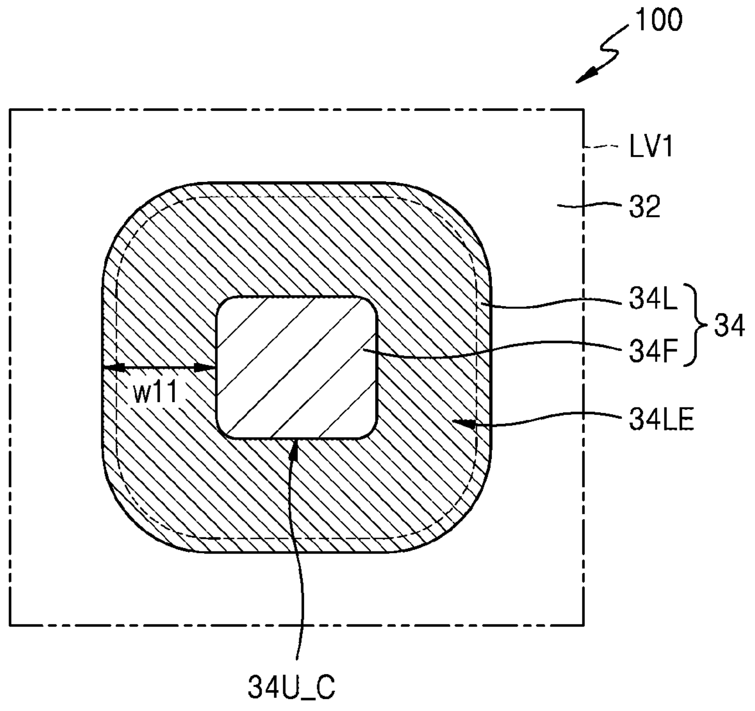
Figure 5:
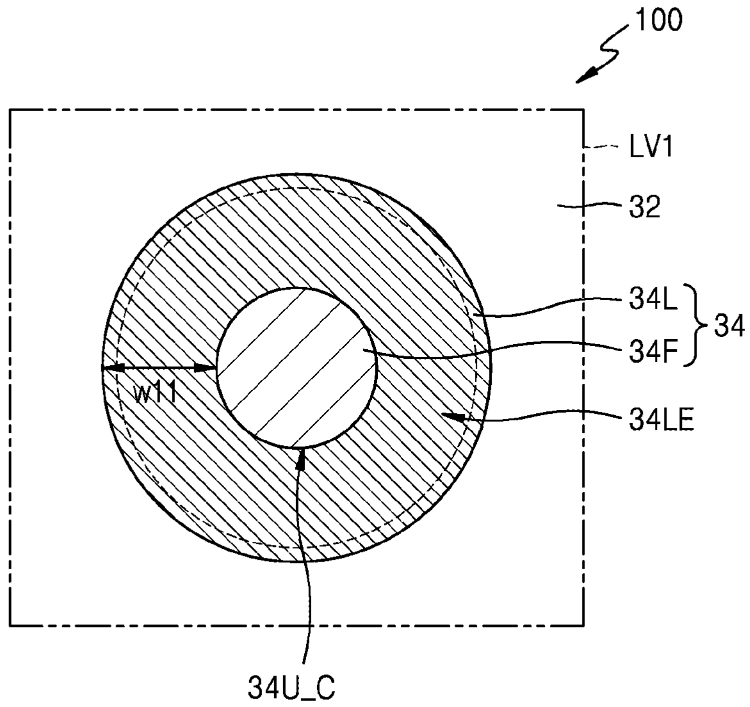

FIG. 1 is a cross-sectional view illustrating a semiconductor package 100 according to some embodiments. FIG. 2 is an enlarged view of part A of FIG. 1. FIGS. 3 to 5 are schematic plan views of a first bonding pad 34.

Referring to FIGS. 1 to 5, the semiconductor package 100 may have a structure in which a first semiconductor chip 10 is bonded to a second semiconductor chip 20. The semiconductor package 100 may have a face-to-face bonding structure in which an active surface of the first semiconductor chip 10 and an active surface of the second semiconductor chip 20 are attached to face each other.

The first semiconductor chip 10 may include a first semiconductor device 12 therein, and the second semiconductor chip 20 may include a second semiconductor device 22 therein. The first semiconductor chip 10 may have a structure including a first substrate 10W, the first semiconductor device 12 disposed on the first substrate 10W, and a first wiring structure 10MS disposed on the first substrate 10W and electrically connected to the first semiconductor device 12, and the second semiconductor chip 20 may have a structure including a second substrate 20W, the second semiconductor device 22 disposed on the second substrate 20W, and a second wiring structure 20MS disposed on the second substrate 20W and electrically connected to the second semiconductor device 22.

A bonding structure BS may be disposed between the first semiconductor chip 10 and the second semiconductor chip 20. The bonding structure BS may include a first bonding insulating layer 32, a first bonding pad 34, a second bonding insulating layer 42, and a second bonding pad 44. The first semiconductor chip 10 and the second semiconductor chip 20 may be attached to each other by a metal-oxide hybrid bonding method in which the first bonding pad 34 and the second bonding pad 44 are attached to each other, and the first bonding insulating layer 32 and the second bonding insulating layer 42 are attached to each other.

The first substrate 10W and the second substrate 20W may be formed based on a group IV material wafer, such as a silicon wafer, or a group III-V compound wafer. In addition, each of the first substrate 10W and the second substrate 20W may be formed as a single crystal wafer, such as a silicon single crystal wafer, in terms of a formation method. However, each of the first substrate 10W and the second substrate 20W is not limited to a single crystal wafer, and various wafers, such as an epitaxial wafer, a polished wafer, an annealed wafer, a silicon on insulator (SOI) wafer, etc., may be used as the first substrate 10W and the second substrate 20W. Here, the epitaxial wafer refers to a wafer in which a crystalline material is grown on a single crystal silicon substrate. Meanwhile, the first substrate 10W and the second substrate 20W may include a well doped with impurities or a structure doped with impurities. In addition, the first substrate 10W and the second substrate 20W may include various device isolation structures, such as a shallow trench isolation (STI) structure.

Each of the first and second semiconductor chips 10 and 20 may include various types of individual devices. For example, each of the first and second semiconductor devices 12 and 22 respectively included in the first and second semiconductor chips 10 and 20 may include various microelectronic devices, for example, a metal-oxide-semiconductor field effect transistor (MOSFET), such as a complementary metal-insulator-semiconductor (CMOS) transistor, an image sensor, such as system large scale integration (LSI), a CMOS imaging sensor (CIS), a micro-electro-mechanical system (MEMS), an active device, a passive device, etc.

In some embodiments, each of the first and second semiconductor chips 10 and 20 may be at least one of a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, and a resistive random access memory (RRAM) chip.

The first bonding insulating layer 32 may be disposed on the first semiconductor chip 10 to cover the first substrate 10W and/or the first wiring structure 10MS. The first bonding insulating layer 32 may include a first pad opening portion 32H, and the first bonding pad 34 may be disposed inside the first pad opening portion 32H. In some embodiments, the first bonding insulating layer 32 may include silicon oxide. For example, the first bonding insulating layer 32 may include at least one of tetraethyl orthosilicate (TEOS), tonen silazane (TOSZ), ALD oxide, flowable chemical vapor deposition (FCVD) oxide, high density plasma (HDP) oxide, or plasma enhanced oxidation (PEOX), but is not limited thereto.

Here, an upper or top surface of the first bonding insulating layer 32 may be referred to as a surface of the first bonding insulating layer 32 facing the second semiconductor chip 20, and a lower or bottom surface of the first bonding insulating layer 32 may be referred to as the surface of the first bonding insulating layer 32 in contact with an upper surface of the semiconductor chip 10 (or an upper surface of the first substrate 10W).

The first bonding pad 34 may be disposed inside the first pad opening portion 32H and may have an upper surface disposed on the same plane as or coplanar with the upper surface of the first bonding insulating layer 32. Here, an upper or top surface of the first bonding pad 34 may be referred to as a surface of the first bonding pad 34 facing the second semiconductor chip 20, and a lower or bottom surface of the first bonding pad 34 may be referred to as the surface of the first bonding pad 34 facing the upper surface of the semiconductor chip 10 (or the upper surface of the first substrate 10W).

The first bonding pad 34 may include a first pad metal layer 34F and a first conductive barrier layer 34L. The first pad metal layer 34F may fill the inside of the first pad opening portion 32H, and the first conductive barrier layer 34L may be disposed between the first pad metal layer 34F and the first bonding insulating layer 32. The first conductive barrier layer 34L may be conformally disposed on an inner wall of the first pad opening portion 32H and may cover or be on sidewalls and a bottom surface of the first pad metal layer 34F.

In some embodiments, the first pad metal layer 34F may include copper (Cu), gold (Au), or an alloy thereof. The first conductive barrier layer 34L may include at least one of titanium (Ti), tantalum (Ta), titanium nitride (TiN), and tantalum nitride (TaN).

In some embodiments, a part of the first conductive barrier layer 34L may extend onto an upper surface edge 34U_E of the first pad metal layer 34F, and the part of the first conductive barrier layer 34L extending onto the upper surface edge 34U_E of the first pad metal layer 34F may be referred to as a horizontal extension portion 34LE. The horizontal extension portion 34LE may be continuously connected to a part of the first conductive barrier layer 34L disposed on the sidewall of the first pad metal layer 34F, and may be integrally formed with the part of the first conductive barrier layer 34L disposed on the sidewall of the first pad metal layer 34F.

The horizontal extension portion 34LE of the first conductive barrier layer 34L is disposed on the upper surface edge 34U_E of the first pad metal layer 34F, and therefore, an upper surface central portion 34U_C of the first pad metal layer 34F may not be covered by the horizontal extension portion 34LE of the first conductive barrier layer 34L. The upper surface central portion 34U_C of the first pad metal layer 34F may function as a region for bonding between the first bonding pad 34 and the second bonding pad 44.

For example, the first conductive barrier layer 34L may have a first thickness t11 in a first direction parallel to the upper surface of the first semiconductor chip 10. For example, the first thickness t11 of the first conductive barrier layer 34L may be in a range of about 10 nanometers to about 50 nanometers. The horizontal extension portion 34LE of the first conductive barrier layer 34L may have a first width w11 in the first direction, and the first width w11 may be greater than the first thickness t11. In some embodiments, the first width w11 may range from about 50 nanometers to about 1 micrometer, but is not limited thereto.

In some embodiments, the first width w11 of the horizontal extension portion 34LE of the first conductive barrier layer 34L may correspond to about 3 to about 15% of the width of the first bonding pad 34 in the first direction. For example, as shown in FIG. 3, which corresponds to a horizontal cross-section at a first vertical level LV1 of FIG. 2, in a plan view, the area of the horizontal extension portion 34LE may correspond to about 10% to about 50% of the upper surface area of the first bonding pad 34, and the upper surface central portion 34U_C of the first pad metal layer 34F not covered by the horizontal extension portion 34LE may correspond to about 50% to about 90% of the upper surface area of the first bonding pad 34.

In some embodiments, as shown in FIG. 3, the first bonding pad 34 may have a square or rectangular horizontal cross-sectional shape, and the horizontal extension portion 34LE of the first conductive barrier layer 34L may have the first width w11 in the horizontal direction and may be disposed to surround the upper surface central portion 34U_C of the first pad metal layer 34F at the edge of the first bonding pad 34.

In some embodiments, as shown in FIG. 4, the first bonding pad 34 may have a rounded square or rectangular horizontal cross-sectional shape, and the horizontal extension portion 34LE of the first conductive barrier layer 34L may follow the planar shape of the first bonding pad 34 at the edge of the first bonding pad 34, and may be disposed to surround the upper surface central portion 34U_C of the first pad metal layer 34F.

In some embodiments, as shown in FIG. 5, the first bonding pad 34 may have a circular or elliptical horizontal cross-sectional shape, and the horizontal extension portion 34LE of the first conductive barrier layer 34L may have an annular horizontal cross-sectional shape at the edge of the first bonding pad 34 and may be disposed to surround the upper surface central portion 34U_C of the first pad metal layer 34F.

In some embodiments, as shown in FIG. 2, the horizontal extension portion 34LE of the first conductive barrier layer 34L may include a protrusion portion 34LP extending and protruding outward with respect to the sidewall of the first pad opening portion 32H of the first bonding insulating layer 32. The protrusion portion 34LP may be disposed at the same vertical level as the upper surface of the first bonding insulating layer 32 or at a position adjacent to the upper surface of the second bonding insulating layer 42, and an upper surface of the protrusion portion 34LP may be flat and connected to the upper surface of the first bonding insulating layer 32.

In some embodiments, the horizontal extension portion 34LE and the protrusion portion 34LP of the first conductive barrier layer 34L may be formed by applying a pushing force to a part of the first conductive barrier layer 34L so that a part of the first conductive barrier layer 34L is transformed to extend in the horizontal direction in a planarization process of the first bonding insulating layer 32. Accordingly, the upper surface of the horizontal extension portion 34LE and the upper surface of the protrusion portion 34LP may be disposed on the same plane as or coplanar with the upper surface of the first bonding insulating layer 32.

The second bonding insulating layer 42 may be disposed on the second semiconductor chip 20 to cover the second substrate 20W and/or the second wiring structure 20MS and may have an upper surface in contact with the upper surface of the first bonding insulating layer 32. The first bonding insulating layer 32 and the second bonding insulating layer 42 in contact with each other may be bonded to each other by applying a high temperature annealing process thereto. The second bonding insulating layer 42 may include a second pad opening portion 42H, and a second bonding pad 44 may be disposed inside the second pad opening portion 42H.

In some embodiments, the second bonding insulating layer 42 may include silicon oxide. For example, the second bonding insulating layer 42 may include at least one of tetraethyl orthosilicate (TEOS), tonen silazane (TOSZ), ALD oxide, flowable chemical vapor deposition (FCVD) oxide, high density plasma (HDP) oxide, or plasma enhanced oxidation (PEOX) oxide, but is not limited thereto.

Here, an upper or top surface of the second bonding insulating layer 42 may be referred to as a surface of the second bonding insulating layer 42 facing the first semiconductor chip 10, and a lower or bottom surface of the second bonding insulating layer 42 may be referred to as a surface of the second bonding insulating layer 42 in contact with the upper surface of the semiconductor chip 20 (or the upper surface of the second substrate 20W).

The second bonding pad 44 may be disposed inside the second pad opening portion 42H and may have an upper surface in contact with the upper surface of the first bonding pad 34 at a position vertically overlapping with the first bonding pad 34. An upper surface of the second bonding pad 44 may be disposed on the same plane as or coplanar with the upper surface of the second bonding insulating layer 42. Here, the upper or top surface of the second bonding pad 44 may be referred to as a surface of the second bonding pad 44 facing the first semiconductor chip 10, and a lower or bottom surface of the second bonding pad 44 may be referred to as the surface of the second bonding pad 44 facing the upper surface of the second semiconductor chip 20 (or the upper surface of the second substrate 20W).

The second bonding pad 44 may include a second pad metal layer 44F and a second conductive barrier layer 44L. The second pad metal layer 44F may fill the inside of the second pad opening portion 42H, and the second conductive barrier layer 44L may be disposed between the second pad metal layer 44F and the second bonding insulating layer 42. The second conductive barrier layer 44L may cover or be on a sidewall and a bottom surface of the second pad metal layer 44F.

In some embodiments, the second pad metal layer 44F may include copper (Cu), gold (Au), or an alloy thereof. The second conductive barrier layer 44L may include at least one of titanium (Ti), tantalum (Ta), titanium nitride (TiN), and tantalum nitride (TaN).

In some embodiments, a part of the second conductive barrier layer 44L may extend on an upper surface edge of the second pad metal layer 44F, and the part of the second conductive barrier layer 44L extending on the upper surface edge of the second pad metal layer 44F may be referred to as a horizontal extension portion 44LE. The horizontal extension portion 44LE may be continuously connected to the part of the second conductive barrier layer 44L disposed on the sidewall of the second pad metal layer 44F, and may be integrally formed with the part of the second conductive barrier layer 44L disposed on the sidewall of the second pad metal layer 44F. The horizontal extension portion 44LE of the second conductive barrier layer 44L may include a protrusion portion 44LP extending and protruding outward with respect to the sidewall of the second pad opening portion 42H of the second bonding insulating layer 42.

As shown in FIG. 2, the upper surface of the second pad metal layer 44F may be in contact with the upper surface of the first pad metal layer 34F, and the horizontal extension portion 44LE of the second conductive barrier layer 44L may be in contact with the horizontal extension portion 34LE of the first conductive barrier layer 34L. The first pad metal layer 34F and the second pad metal layer 44F may be bonded by inter-diffusion of metal atoms through high temperature annealing.

In some embodiments, similar to that described above with respect to the first bonding pad 34, the area of the horizontal extension portion 44LE may correspond to about 10% to about 50% of the upper surface area of the second bonding pad 44, and an upper central portion of the second pad metal layer 44F not covered by the horizontal extension portion 44LE may correspond to about 50% to about 90% of the upper surface area of the second bonding pad 44, and accordingly, the bonding area between the first pad metal layer 34F and the second pad metal layer 44F may correspond to about 50% to about 90% of the upper surface area of the first bonding pad 34 or the second bonding pad 44.

In general, in a package structure in which a first semiconductor chip and a second semiconductor chip are bonded to each other by a hybrid bonding method of a bonding pad and a bonding insulating layer, a planarization process is performed so that the bonding pad and the bonding insulating layer have the same upper surface level. However, in the planarization process, dishing may occur because more metal materials, such as copper included in the bonding pad, are removed, and in this case, bonding defects may occur.

However, according to some embodiments, the horizontal extension portion 34LE of the first conductive barrier layer 34L may act as a diffusion barrier preventing diffusion of copper atoms included in the first pad metal layer 34F, and accordingly, diffusion and/or expansion of copper atoms through the upper surface central portion 34U_C of the first pad metal layer 34F may be induced. Accordingly, defects in the bonding process of the first bonding pad 34 and the second bonding pad 44 may be prevented, and bonding of sufficient strength between the first bonding pad 34 and the second bonding pad 44 may be secured.

Figure 6:
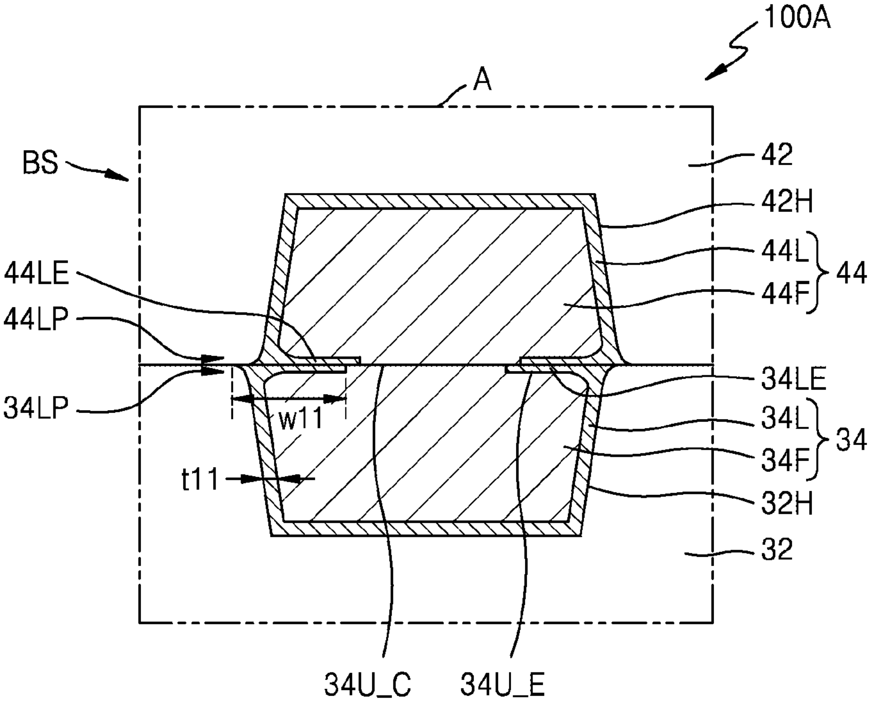
FIG. 6 is a cross-sectional view illustrating a semiconductor package according to some embodiments.

FIG. 6 is a cross-sectional view illustrating a semiconductor package 100A according to some embodiments. In FIG. 6, the same reference numerals as in FIGS. 1 to 5 denote the same components.

Referring to FIG. 6, the second bonding pad 44 may be spaced apart or offset from the upper surface of the first bonding pad 34 by a certain distance in the horizontal direction and bonded to the first bonding pad 34. For example, the second bonding pad 44 and the first bonding pad 34 may not overlap completely vertically, but may be misaligned with each other by a certain distance and bonded to each other.

As shown in FIG. 6, the horizontal extension portion 34LE of the first conductive barrier layer 34L may be disposed on an edge of the first bonding pad 34, and the upper surface edge 34U_E of the first pad metal layer 34F may be covered by the horizontal extension portion 34LE of the first conductive barrier layer 34L. Accordingly, the upper surface edge 34U_E of the first pad metal layer 34F may not be in direct contact with the second bonding insulating layer 42, and the upper surface edge of the second pad metal layer 44F may not be in direct contact with the first bonding insulating layer 32. In addition, the upper surface central portion 34U_C of the first pad metal layer 34F may not be in contact with the second bonding insulating layer 42, and may be in contact with the horizontal extension portion 44LE of the second conductive barrier layer 44L of the second bonding pad 44.

According to some embodiments, even when the first bonding pad 34 and the second bonding pad 44 are misaligned and bonded to each other, the first pad metal layer 34F is not in contact with the second bonding insulating layer 42 and is in contact with the horizontal extension portion 44LE of the second conductive barrier layer 44L of the second bonding pad 44, which may prevent a reduction in local bonding force or formation of void that may occur at the copper-oxide bonding interface.

Figure 7:
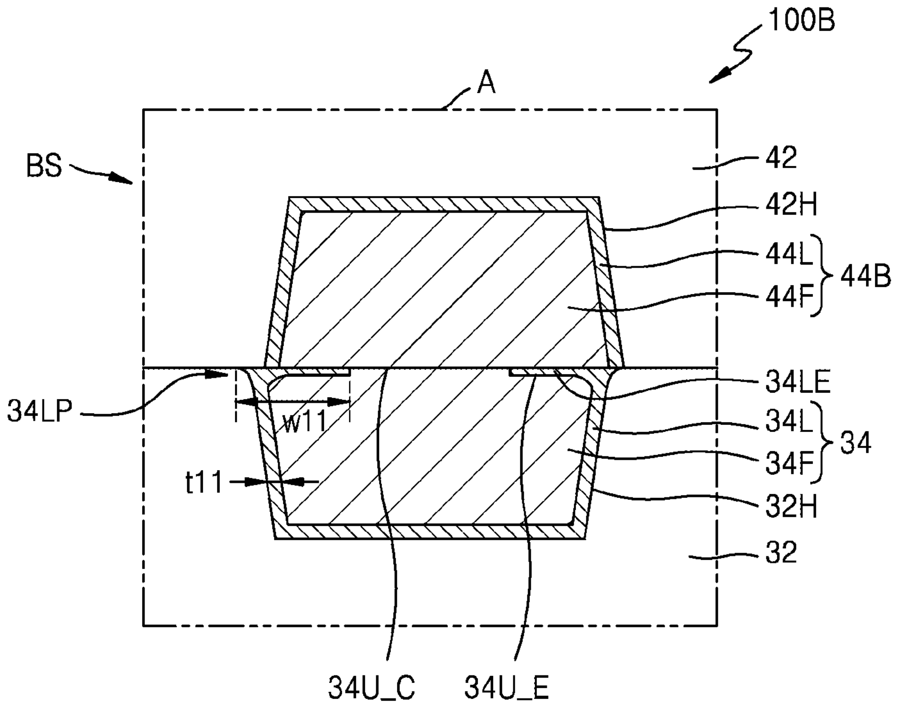
FIG. 7 is a cross-sectional view illustrating a semiconductor package according to some embodiments.

FIG. 7 is a cross-sectional view illustrating a semiconductor package 100B according to some embodiments. In FIG. 7, the same reference numerals as in FIGS. 1 to 6 denote the same components.

Referring to FIG. 7, the first conductive barrier layer 34L of the first bonding pad 34 may include the horizontal extension portion 34LE, and the second conductive barrier layer 44L of the second bonding pad 44B may not include a horizontal extension portion. The second conductive barrier layer 44L of the second bonding pad 44B may be disposed on the sidewall and the bottom surface of the second pad opening portion 42H, and the entire upper surface of the second pad metal layer 44F may not be covered by the second conductive barrier layer 44L. The upper surface of the second pad metal layer 44F may be in contact with the upper surface central portion 34U_C of the first pad metal layer 34F and the horizontal extension portion 34LE of the first conductive barrier layer 34L.

According to some embodiments, the horizontal extension portion 34LE of the first conductive barrier layer 34L may act as a diffusion barrier preventing diffusion of copper atoms included in the first pad metal layer 34F, and accordingly, diffusion and/or expansion of copper atoms through the upper surface central portion 34U_C of the first pad metal layer 34F may be induced. Accordingly, a defect in a bonding process of the first bonding pad 34 and the second bonding pad 44B may be prevented, and bonding of sufficient strength between the first bonding pad 34 and the second bonding pad 44B may be secured.

Figure 8:
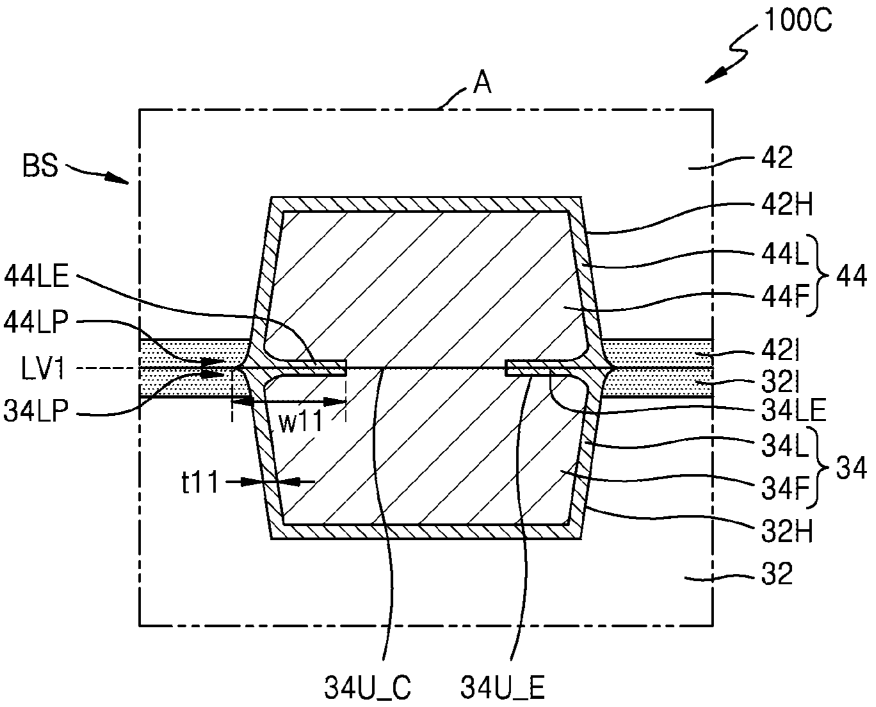
FIG. 8 is a cross-sectional view illustrating a semiconductor package according to some embodiments.

FIG. 8 is a cross-sectional view illustrating a semiconductor package 100C according to some embodiments. In FIG. 8, the same reference numerals as in FIGS. 1 to 7 denote the same components.

Referring to FIG. 8, a first interfacial insulating layer 321 and a second interfacial insulating layer 421 may be further disposed between the first bonding insulating layer 32 and the second bonding insulating layer 42. The first interfacial insulating layer 321 may have an upper surface disposed on the same plane as the upper surface of the first bonding pad 34, and the first pad opening portion 32H may extend to the upper surface of the first interfacial insulating layer 321. The horizontal extension portion 34LE of the first conductive barrier layer 34L may be planarly surrounded by the first interfacial insulating layer 321. The second interfacial insulating layer 421 may have an upper surface disposed on the same plane as the upper surface of the second bonding pad 44, and the second pad opening portion 42H may extend to the upper surface of the second interfacial insulating layer 421. The horizontal extension portion 44LE of the second conductive barrier layer 44L may be planarly surrounded by the second interfacial insulating layer 421. The upper surface of the second interfacial insulating layer 421 may be in contact with the upper surface of the first interfacial insulating layer 321.

In some embodiments, the first and second interfacial insulating layers 321 and 421 may include at least one of tetraethyl orthosilicate (TEOS), Tonen Silazane (TOSZ), ALD oxide, Flowable Chemical Vapor Deposition (FCVD) oxide, High Density Plasma (HDP) oxide, Plasma Enhanced Oxidation (PEOX) oxide, or silicon carbon nitride (SiCN), and may include materials different from those of the first and second bonding insulating layers 32 and 42. In some embodiments, the first and second bonding insulating layers 32 and 42 may include silicon oxide, and the first and second interfacial insulating layers 321 and 421 may include silicon carbon nitride (SiCN).

Figure 9:
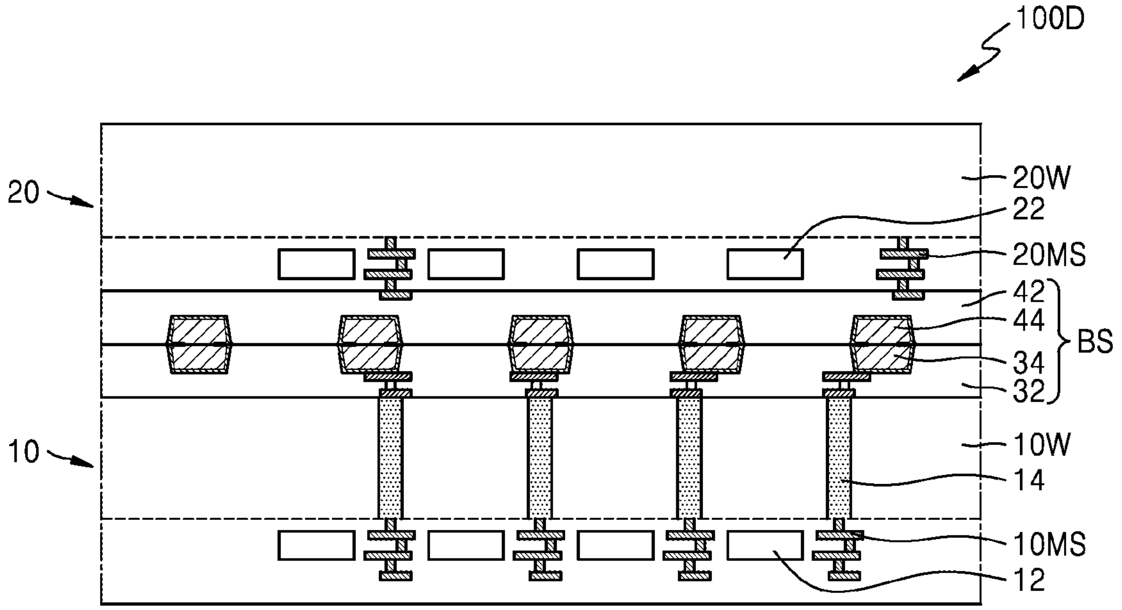
FIG. 9 is a cross-sectional view illustrating a semiconductor package according to some embodiments.

FIG. 9 is a cross-sectional view illustrating a semiconductor package 100D according to some embodiments.

Referring to FIG. 9, the semiconductor package 100D may have a face-to-back bonding structure in which the inactive surface of the first semiconductor chip 10 and the active surface of the second semiconductor chip 20 are attached to face each other. For example, the bonding structure BS may be attached to the inactive surface of the first semiconductor chip 10 (i.e., a surface opposite to the active surface of the first semiconductor chip 10 on which the first semiconductor device 12 is provided).

In some embodiments, the first semiconductor chip 10 may further include a through electrode 14, the through electrode 14 may penetrate the first substrate 10W and be electrically connected to the first semiconductor device 12 and/or the first wiring structure 10MS, and the first bonding pad 34 may be electrically connected to the first semiconductor device 12 and/or the first wiring structure 10MS through the through electrode 14.

Figure 10:
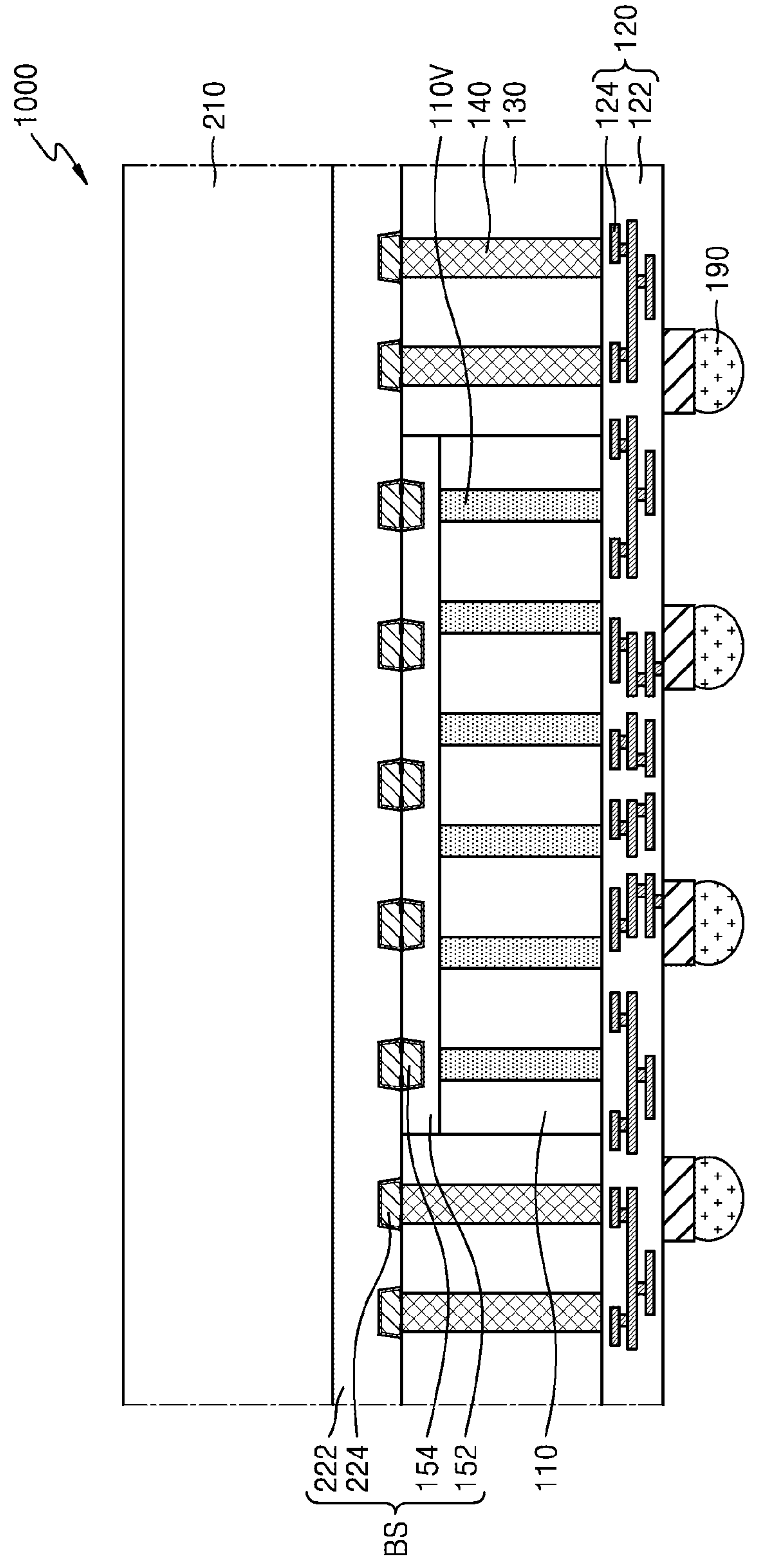
FIG. 10 is a cross-sectional view illustrating a semiconductor package according to some embodiments.

FIG. 10 is a cross-sectional view illustrating a semiconductor package 1000 according to some embodiments.

Referring to FIG. 10, the semiconductor package 1000 may include a first semiconductor chip 110, a first redistribution layer 120, a molding layer 130, a connection pillar 140, external connection terminals 190, a bonding structure BS, and a second semiconductor chip 210.

In an embodiment, the semiconductor package 1000 is a semiconductor package having a fan-out structure, and a footprint of the first semiconductor chip 110 may be smaller than a footprint of the first redistribution layer 120. That is, at least one of the plurality of external connection terminals 190 may be disposed at a position horizontally spaced apart from the side surface of the first semiconductor chip 110 toward the outside.

The semiconductor package 1000 may have a structure in which the first semiconductor chip 110 and the second semiconductor chip 210 are bonded to each other by the bonding structure BS. The semiconductor package 1000 may be a system in package (SIP) in which different types of semiconductor chips are bonded and electrically connected to each other by the bonding structure BS and operate as one system.

Each of the first semiconductor chip 110 and the second semiconductor chip 210 may be a memory chip or a logic chip. The memory chip may be, for example, a volatile memory chip, such as a dynamic random access memory (DRAM) chip or a static random access memory (SRAM) chip, or may be a non-volatile memory chip, such as a phase-change random access memory (PRAM) chip, a magnetic random access memory (MRAM) chip, a ferroelectric random access memory (FeRAM) chip, or a resistive random access memory (RRAM) chip. Also, the logic chip may be, for example, a microprocessor, an analog device, or a digital signal processor.

A stacked structure of the first semiconductor chip 110 and the second semiconductor chip 210 may be disposed on the first redistribution layer 120. The first redistribution layer 120 may include a first insulating layer 122 and a first redistribution pattern 124. The first semiconductor chip 110, the molding layer 130, and the connection pillar 140 may be disposed on an upper surface of the first redistribution layer 120, and the external connection terminal 190 may be disposed on a lower surface of the first redistribution layer 120.

The first insulating layer 122 may include at least any one of an insulating material, for example, a photosensitive insulating material such as Photo Imageable Dielectric (PID), a thermosetting resin such as an epoxy resin, a thermoplastic resin such as polyimide, or a resin impregnated in a core material, such as glass fiber together with an inorganic filler. The first insulating layer 122 may include a plurality of layers. In this case, the plurality of layers may include the same material, and may include different materials as necessary. The first redistribution pattern 124 may be disposed on each of the plurality of layers included in the first insulating layer 122. In some embodiments, the first redistribution pattern 124 may include at least one of copper (Cu), aluminum (Al), silver (Ag), titanium (Ti), and nickel (Ni).

The molding layer 130 on the first redistribution layer 120 may cover at least a portion of the first semiconductor chip 110. The molding layer 130 may include, for example, at least one of an epoxy molding compound (EMC), a resin, or silica. The molding layer 130 may include a plurality of layers. For example, a first layer of the molding layer 130 may directly cover at least portions of the first semiconductor chip 110 and the first redistribution layer 120, and one or more layers disposed on the upper surface of the first layer may serve as warpage control. In this case, the plurality of layers may include the same material, but may include different materials as necessary.

The connection pillar 140 may be disposed between the first redistribution layer 120 and the second semiconductor chip 210, and may penetrate the molding layer 130 in a vertical direction (Z direction). The connection pillar 140 may include a conductive material for electrically connecting the first redistribution layer 120 to the second semiconductor chip 210, for example, at least one of copper (Cu), aluminum (Al), silver (Ag), titanium (Ti), and nickel (Ni). In some embodiments, the connection pillar 140 may include copper.

The bonding structure BS may be disposed between the first semiconductor chip 110 and the second semiconductor chip 210. The bonding structure BS may include a first bonding insulating layer 152, a first bonding pad 154, a second bonding insulating layer 222, and a second bonding pad 224. The first bonding insulating layer 152 and the first bonding pad 154 may be disposed on the upper surface of the first semiconductor chip 110 so as to be surrounded by the molding layer 130. The second bonding insulating layer 222 and the second bonding pad 224 may be disposed between the second semiconductor chip 210 and the first semiconductor chip 110 and between the second semiconductor chip 210 and the molding layer 130. At least one of the second bonding pads 224 may be disposed to contact the connection pillar 140 or be connected to the connection pillar 140. Any one of the first bonding pad 154 and the second bonding pad 224 may have the same or similar technical characteristics as that of the first and second bonding pads 34 and 44 described with reference to FIGS. 1 to 9.

In some embodiments, the first semiconductor chip 110 may include a plurality of through electrodes 110V, and the plurality of through electrodes 110V may be electrically connected to the first bonding pad 154 and/or the first redistribution pattern 124.

In some embodiments, the second semiconductor chip 210 may have a horizontal width that is greater than a horizontal width of the first semiconductor chip 110. The second semiconductor chip 210 may be disposed to cover the upper surface of the first semiconductor chip 110 and the entire upper surface of the molding layer 130.

The external connection terminal 190 may be disposed on the lower surface of the first redistribution layer 120. The external connection terminal 190 may electrically connect the semiconductor package 1000 to an external device, such as a system substrate or a main board. The external connection terminal 190 may be, for example, a solder ball, a bump, a pin, or a land. The external connection terminal 190 may include at least one of copper (Cu), aluminum (Al), silver (Ag), titanium (Ti), nickel (Ni), and tin (Sb).

Figure 11:
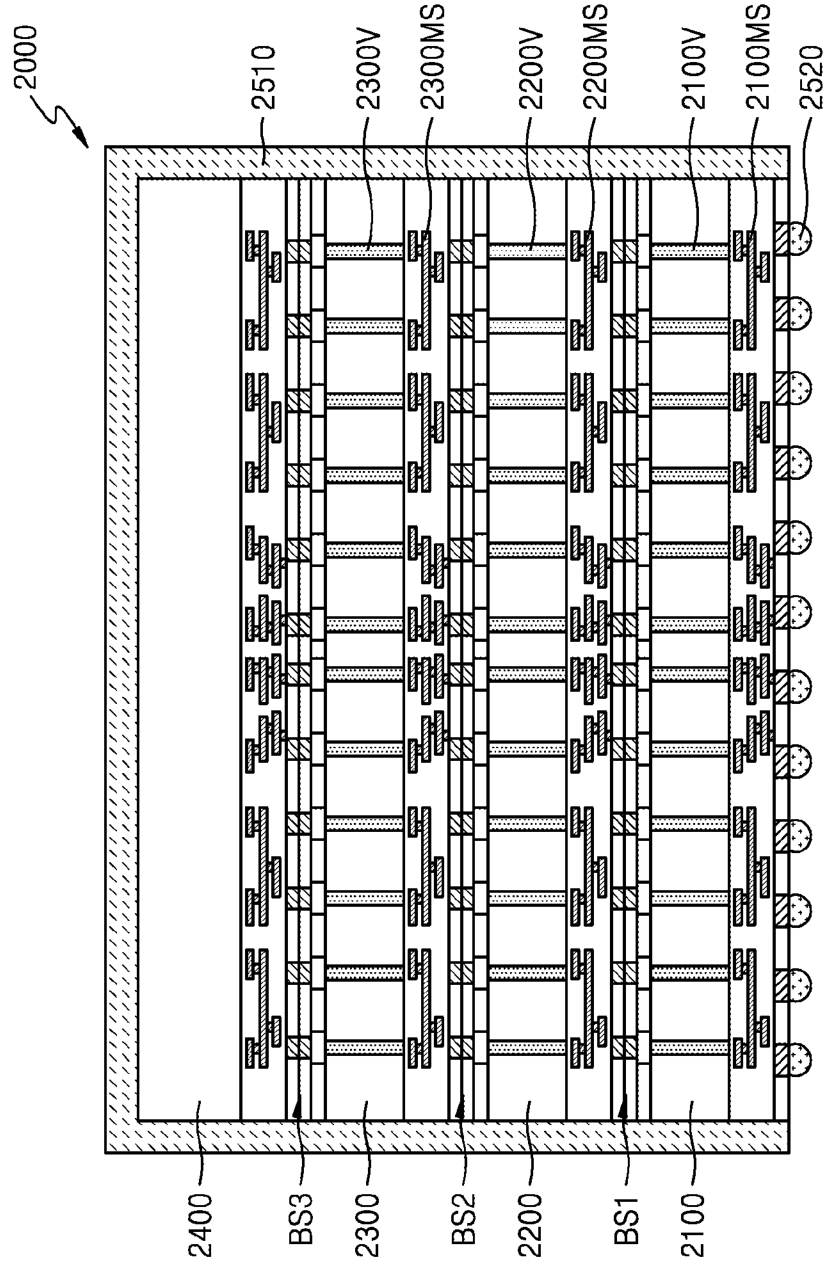
FIG. 11 is a cross-sectional view illustrating a semiconductor package according to some embodiments.

FIG. 11 is a cross-sectional view illustrating a semiconductor package 2000 according to some embodiments.

Referring to FIG. 11, the semiconductor package 2000 may include a first semiconductor chip 2100, a second semiconductor chip 2200, a third semiconductor chip 2300, and a fourth semiconductor chip 2400. Bonding structures BS1, BS2, and BS3 may be disposed between the first semiconductor chip 2100 and the second semiconductor chip 2200, between the second semiconductor chip 2200 and the third semiconductor chip 2300, and between the third semiconductor chip 2300 and the fourth semiconductor chip 2400. The bonding structures BS1, BS2, and BS3 may have the same or similar technical characteristics as that of the bonding structure BS described with reference to FIGS. 1 to 9, and may include the first and second bonding pads 34 and 44 and the first and second bonding insulating layers 32 and 42 described with reference to FIGS. 1 to 9.

In some embodiments, the first semiconductor chip 2100, the second semiconductor chip 2200, and the third semiconductor chip 2300 may respectively include a first through electrode 2100V, a second through electrode 2200V, and a third through electrode 2300V, and the first through electrode 2100V, the second through electrode 2200V, and the third through electrode 2300V may be respectively connected to bonding pads included in the bonding structures BS1, BS2, and BS3 through wiring patterns 2100MS, 2200MS, and 2300MS.

A molding layer 2510 surrounding the upper and side surfaces of the first to fourth semiconductor chips 2100, 2200, 2300, and 2400 may be further disposed, and an external connection terminal 2520 may be attached to the lower surface of the first semiconductor chip 2100.

In some embodiments, the first to fourth semiconductor chips 2100, 2200, 2300, and 2400 may be memory chips or logic chips. For example, the first to fourth semiconductor chips 2100, 2200, 2300, and 2400 may all be the same type of memory chips, at least one of the first to fourth semiconductor chips 2100, 2200, 2300, and 2400 may be a logic chip, and the remainder of the first to fourth semiconductor chips 2100, 2200, 2300, and 2400 may be memory chips.

Figure 12:
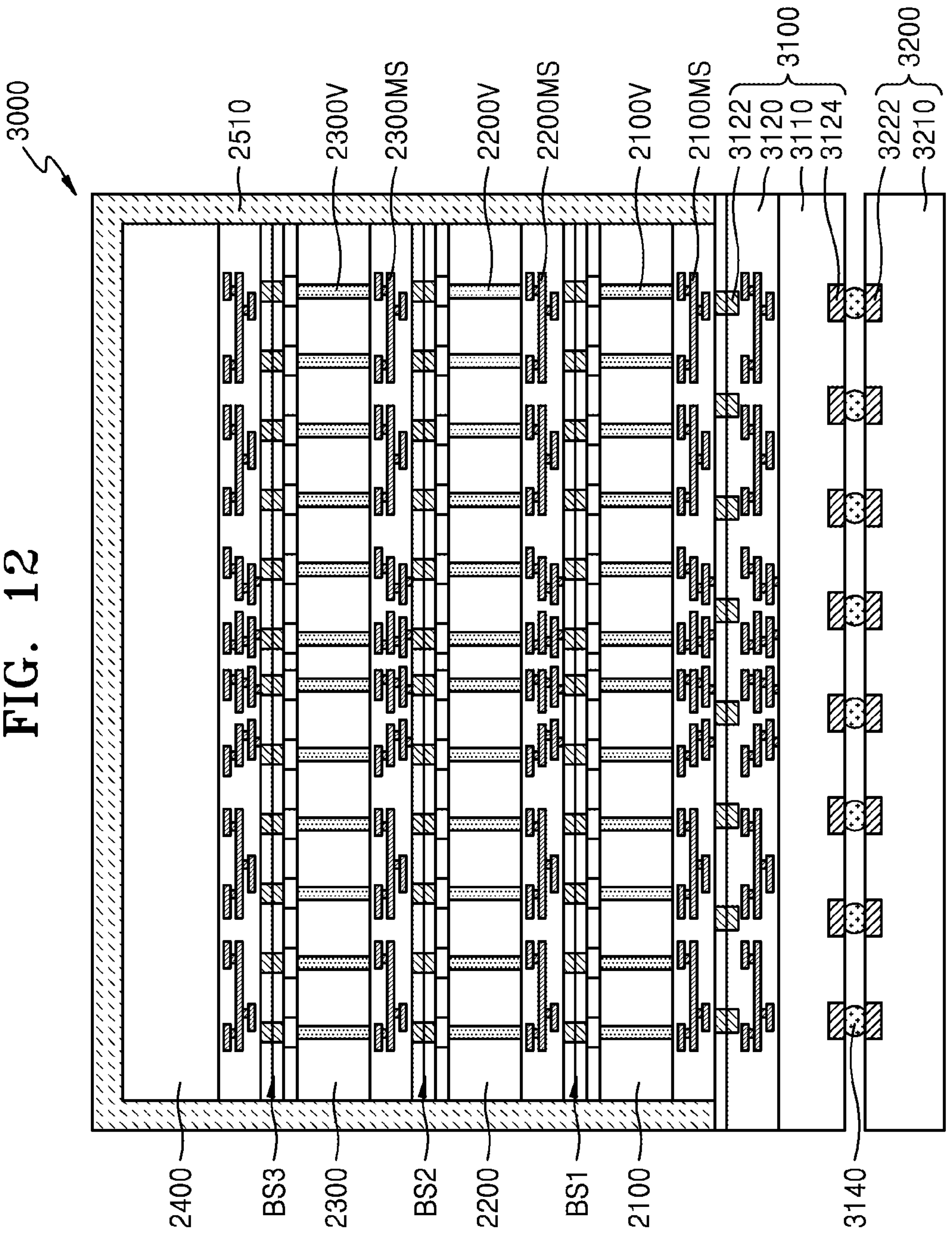
FIG. 12 is a cross-sectional view illustrating a semiconductor package according to some embodiments.

FIG. 12 is a cross-sectional view illustrating a semiconductor package 3000 according to some embodiments.

Referring to FIG. 12, the semiconductor package 3000 may further include an interposer 3100. The interposer 3100 may include a base layer 3110, a redistribution layer 3120, a first upper surface pad 3122, and a first lower surface pad 3124. A through via (not shown) electrically connecting the first upper surface pad 3122 to the first lower surface pad 3124 may be further disposed inside the base layer 3110. The interposer 3100 and the first semiconductor chip 2100 may be attached to each other through metal-oxide hybrid bonding using the first upper surface pad 3122. Alternatively, the interposer 3100 and the first semiconductor chip 2100 may be connected to each other through a connection bump (not shown).

A main board 3200 may include a base board layer 3210 and a second upper surface pad 3222, and the first lower surface pad 3124 of the interposer 3100 may be electrically connected to the second upper surface pad 3222 of the main board 3200 by a board connection terminal 3140.

Figure 13:
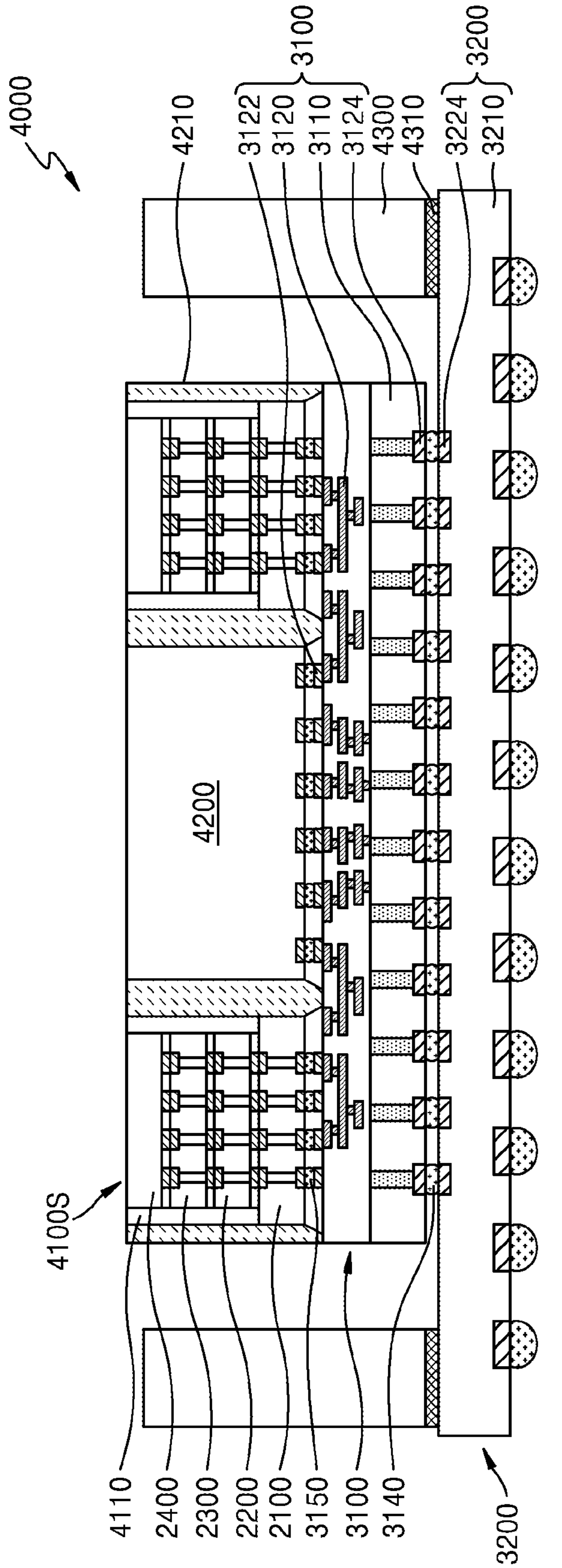
FIG. 13 is a cross-sectional view illustrating a semiconductor package according to some embodiments.

FIG. 13 is a cross-sectional view illustrating a semiconductor package 4000 according to some embodiments.

Referring to FIG. 13, the semiconductor package 4000 may include a main board 3200 on which the interposer 3100 is mounted, sub-semiconductor packages 4100S each including the first to fourth semiconductor chips 2100, 2200, 2300, and 2400 attached to the interposer 3100, and a fifth semiconductor chip 4200. The sub-semiconductor package 4100S may correspond to the semiconductor package 2000 described with reference to FIG. 11. Also, the semiconductor package 4000 may be referred to as a system.

The semiconductor package 4000 is illustrated as including two sub-semiconductor packages 4100S in FIG. 13, but the inventive concept is not limited thereto. For example, the semiconductor package 4000 may include one sub-semiconductor package 4100S or three or more sub-semiconductor packages 4100S.

The first to fourth semiconductor chips 2100, 2200, 2300, and 2400 may each include a dynamic random access memory (DRAM), a static random access memory (SRAM), a flash memory, an electrically erasable and programmable read-only memory (EPROM), a phase-change random access memory (PRAM), a magnetic random access memory (MRAM), or a resistive random access memory (RRAM). In some embodiments, the first semiconductor chip 2100 may not include a memory cell. The first semiconductor chip 2100 may include a serial-parallel conversion circuit, a test logic circuit, such as a design for test (DFT), a Joint Test Action Group (JTAG), and a memory built-in self-test (MBIST), and a signal interface circuit, such as PHY. The second to fourth semiconductor chips 2200, 2300, and 2400 may include memory cells. For example, the first semiconductor chip 2100 may be a buffer chip for controlling the second to fourth semiconductor chips 2200, 2300, and 2400.

In some embodiments, the first semiconductor chip 2100 may be a buffer chip for controlling HBM DRAM, and the second to fourth semiconductor chips 2200, 2300, and 2400 may be memory cell chips including cells of the HBM DRAM controlled by the first semiconductor chip 2100. The first semiconductor chip 2100 may be referred to as a buffer chip or a master chip, and the second to fourth semiconductor chips 2200, 2300, and 2400 may each be referred to as a slave chip or a memory cell chip. The sub-semiconductor package 4100S including the first to fourth semiconductor chips 2100, 2200, 2300, and 2400 may be referred to as an HBM DRAM device.

The sub-semiconductor package 4100S may further include a chip molding layer 4110 surrounding the second to fourth semiconductor chips 2200, 2300, and 2400 on the upper surface of the first semiconductor chip 2100. The chip molding layer 4110 may include, for example, EMC.

The fifth semiconductor chip 4200 may be a logic semiconductor chip. The fifth semiconductor chip 4200 may include one of, for example, a central processing unit (CPU) chip, a graphic processing unit (GPU) chip, an application processor (AP) chip, an application specific integrated circuit (ASIC) or other processing chips.

At least one sub-semiconductor package 4100S may be electrically connected to the interposer 3100 by the connection bump 3150, and the fifth semiconductor chip 4200 may be attached and electrically connected to the interposer 3100 by the connection bump 3150. However, unlike this, the at least one sub-semiconductor package 4100S and the fifth semiconductor chip 4200 may be attached and electrically connected onto the interposer 3100 by bonding pads (not shown).

The semiconductor package 4000 may further include a package molding layer 4210 surrounding the at least one sub-semiconductor package 4100S and the fifth semiconductor chip 4200 on the interposer 3100. The package molding layer 4210 may include, for example, EMC.

The semiconductor package 4000 may further include a stiffener structure 4300 attached to the main board 3200. The stiffener structure 4300 may be attached to the main board 3200 with a stiffener thermal interface material layer 4310 therebetween. The stiffener structure 4300 may be disposed to be spaced apart from the at least one sub-semiconductor package 4100S and the fifth semiconductor chip 4200. The stiffener structure 4300 may extend along the edge of the main board 3200 planarly, that is, in a top-view, to surround the at least one sub-semiconductor package 4100S and the fifth semiconductor chip 4200.

The stiffener structure 4300 may be made of metal. For example, the stiffener structure 4300 may include at least one of copper, nickel, and stainless steel. The stiffener thermal interface material layer 4310 may be made of an insulating material or a material capable of maintaining electrical insulation including an insulating material. The stiffener thermal interface material layer 4310 may include, for example, an epoxy resin. The stiffener thermal interface material layer 4310 may include, for example, mineral oil, grease, gap filler putty, phase change gel, a phase change material pad, or a particle filled epoxy. For example, the stiffener structure 4300 may have a vertical height of about 500 μm to about 800 μm.

Figure 14:
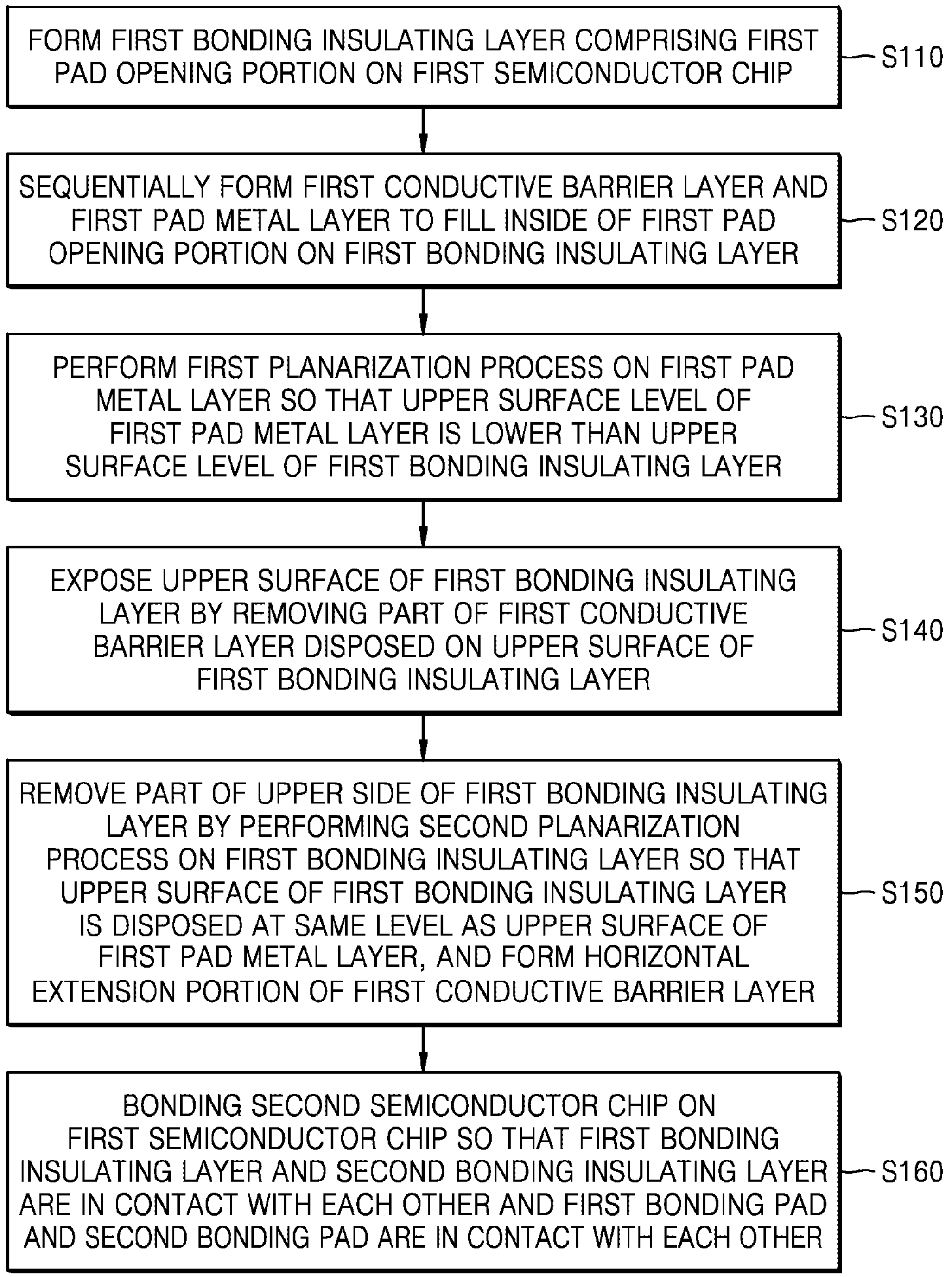
FIG. 14 is a flowchart illustrating a method of manufacturing a semiconductor package, according to some embodiments.

FIG. 14 is a flowchart illustrating a method of manufacturing a semiconductor package, according to some embodiments.

FIGS. 15 to 20 are cross-sectional views illustrating a method of manufacturing a semiconductor package, according to some embodiments. FIGS. 15 to 20 may correspond to the method of manufacturing the semiconductor package 100 described with reference to FIGS. 1 to 5.

Figure 15:
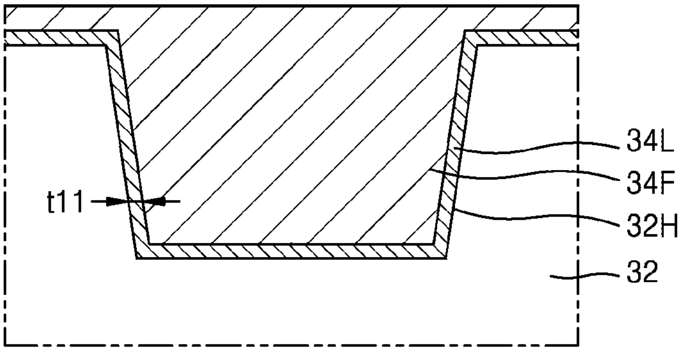
FIGS. 15 to 20 are cross-sectional views illustrating a method of manufacturing a semiconductor package, according to some embodiments.

Referring to FIGS. 14 and 15, the first bonding insulating layer 32 including the first pad opening portion 32H may be formed on the first semiconductor chip 10 (see FIG. 1) (operation S110).

In some embodiments, the first semiconductor chip 10 may be provided in a wafer state in which the first substrate 10W (see FIG. 1) is not sawed or in a die state after the first substrate 10W is sawed.

In some embodiments, the first pad opening portion 32H may be formed by forming a mask pattern on the first bonding insulating layer 32, and removing a part of the first bonding insulating layer 32 using the mask pattern as an etching mask. Although not shown, a part of the first wiring structure 10MS may be exposed through a bottom part of the first pad opening portion 32H.

Thereafter, the first conductive barrier layer 34L and the first pad metal layer 34F may be sequentially formed on the first bonding insulating layer 32 to fill the inside of the first pad opening portion 32H (operation S120).

In some embodiments, the first conductive barrier layer 34L may be formed to have the first thickness t11 in a horizontal direction or parallel to the upper surface of the first semiconductor chip 10, and may be conformally disposed on the inner wall of the first pad opening portion 32H and the upper surface of the first bonding insulating layer 32. For example, the first thickness t11 may be in a range of about 10 to about 50 nanometers. In some embodiments, the first conductive barrier layer 34L may be formed by a physical vapor deposition (PVD) process, a chemical vapor deposition (CVD) process, etc. using at least one of titanium (Ti), tantalum (Ta), titanium nitride (TiN), and tantalum nitride (TaN).

In some embodiments, the first pad metal layer 34F may be formed on the first conductive barrier layer 34L to a thickness sufficient to completely fill the inside of the first pad opening portion 32H. The first pad metal layer 34F may include copper (Cu), gold (Au), or an alloy thereof, and may be formed by an electrolytic plating process, an electroless plating process, a physical vapor deposition (PVD) process, etc.

Figure 16:
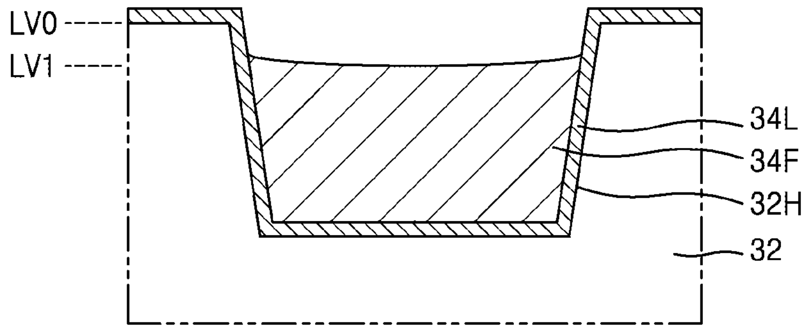

Referring to FIGS. 14 and 16, a part of the upper side of the first pad metal layer 34F may be removed by performing a first planarization process on the first pad metal layer 34F so that the upper surface level of the first pad metal layer 34F is lower than the upper surface level of the first bonding insulating layer 32 (operation S130).

In some embodiments, after performing the first planarization process, the upper surface of the first bonding insulating layer 32 may be disposed at a reference vertical level LV0, and the upper surface of the first pad metal layer 34F may be disposed at a first vertical level LV1. In some embodiments, the difference between the first vertical level LV1 and the reference vertical level LV0 may correspond to about 10 to about 400 angstroms, but the inventive concept is not limited thereto.

In some embodiments, the first planarization process may be a process using an etch condition having an etch selectivity with respect to the first conductive barrier layer 34L. For example, during the first planarization process, the etching rate of the first conductive barrier layer 34L may be significantly lower than the etching rate of the first pad metal layer 34F. For example, while the upper surface level of the first pad metal layer 34F is lowered, the first conductive barrier layer 34L may be hardly removed or the amount of etching of the first conductive barrier layer 34L may be insignificant.

In some embodiments, the first planarization process may be performed so that the upper surface of the first conductive barrier layer 34L is exposed. Accordingly, the first conductive barrier layer 34L may remain on the upper surface of the first bonding insulating layer 32, and the upper surface of the first bonding insulating layer 32 may be hardly exposed to the etching atmosphere.

Figure 17:
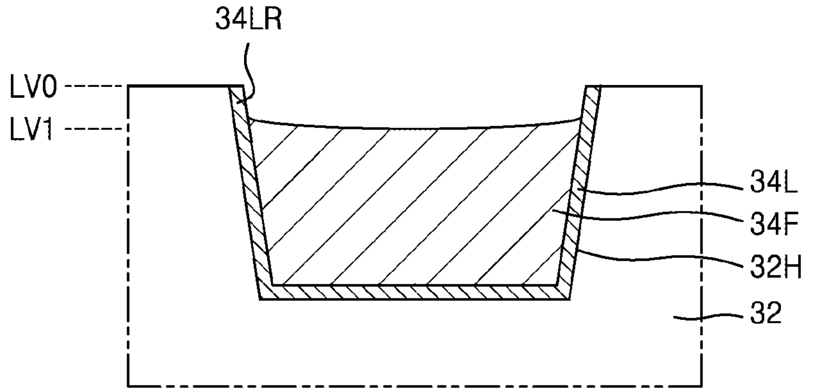

Referring to FIGS. 14 and 17, the upper surface of the first bonding insulating layer 32 may be exposed by removing a part of the first conductive barrier layer 34L disposed on the upper surface of the first bonding insulating layer 32 (operation S140).

In some embodiments, the removal process of the first conductive barrier layer 34L may be a wet etching process or a dry etching process. In this regard, a portion 34LR of the first conductive barrier layer 34L disposed on the inner wall of the first pad opening portion 32H may remain without being removed. In some embodiments, the portion 34LR of the first conductive barrier layer 34L may have a height of about 10 to about 400 angstroms in a vertical direction.

Figure 18:
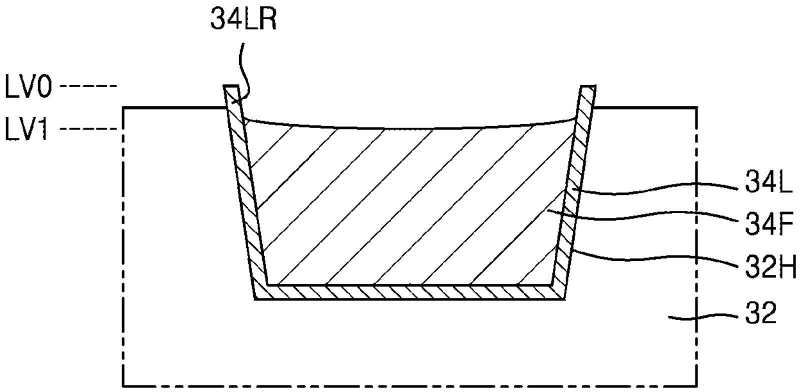
Figure 19:
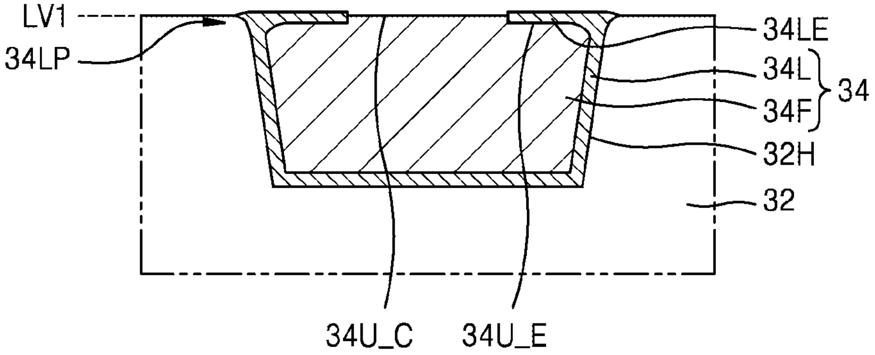

Referring to FIGS. 14, 18 and 19, a part of the upper side of the first bonding insulating layer 32 may be removed by performing a second planarization process on the first bonding insulating layer 32 so that the upper surface of the first bonding insulating layer 32 is disposed at the same level as the upper surface of the first pad metal layer 34F, and the horizontal extension portion 34LE of the first conductive barrier layer 34L may be formed (operation S150).

In some embodiments, the second planarization process may be a process using an etch condition having an etch selectivity with respect to the first conductive barrier layer 34L. For example, the second planarization process is performed, and therefore, the part of the upper side of the first bonding insulating layer 32 may be removed so that the upper surface of the first bonding insulating layer 32 may be disposed at a vertical level lower than the reference vertical level LV0.

As shown in FIG. 18, which schematically shows the shape of the first conductive barrier layer 34L during the second planarization process, a portion 34LR of the first conductive barrier layer 34L may remain without being removed during the second planarization process and may protrude upward with respect to the upper surface of the first bonding insulating layer 32. However, the second planarization process is performed, and therefore, a pushing force may be applied to the portion 34LR of the first conductive barrier layer 34L disposed at a vertical level higher than the upper surface of the first bonding insulating layer 32. Accordingly, the portion 34LR of the first conductive barrier layer 34L may be transformed such that the portion 34LR of the first conductive barrier layer 34L extends onto the upper surface of the first pad metal layer 34F, which is a relatively empty space.

As shown in FIG. 19, which schematically shows the shape of the first conductive barrier layer 34L after the second planarization process is completed, the horizontal extension portion 34LE may be continuously connected to a part of the first conductive barrier layer 34L disposed on the sidewall of the first pad metal layer 34F, and may be integrally formed with the part of the first conductive barrier layer 34L disposed on the sidewall of the first pad metal layer 34F. The horizontal extension portion 34LE of the first conductive barrier layer 34L may include the protrusion portion 34LP extending and protruding outward with respect to the sidewall of the first pad opening portion 32H of the first bonding insulating layer 32.

The horizontal extension portion 34LE of the first conductive barrier layer 34L is disposed on the upper surface edge 34U_E of the first pad metal layer 34F, and therefore, the upper surface central portion 34U_C of the first pad metal layer 34F may not be covered by the horizontal extension portion 34LE of the first conductive barrier layer 34L.

Figure 20:
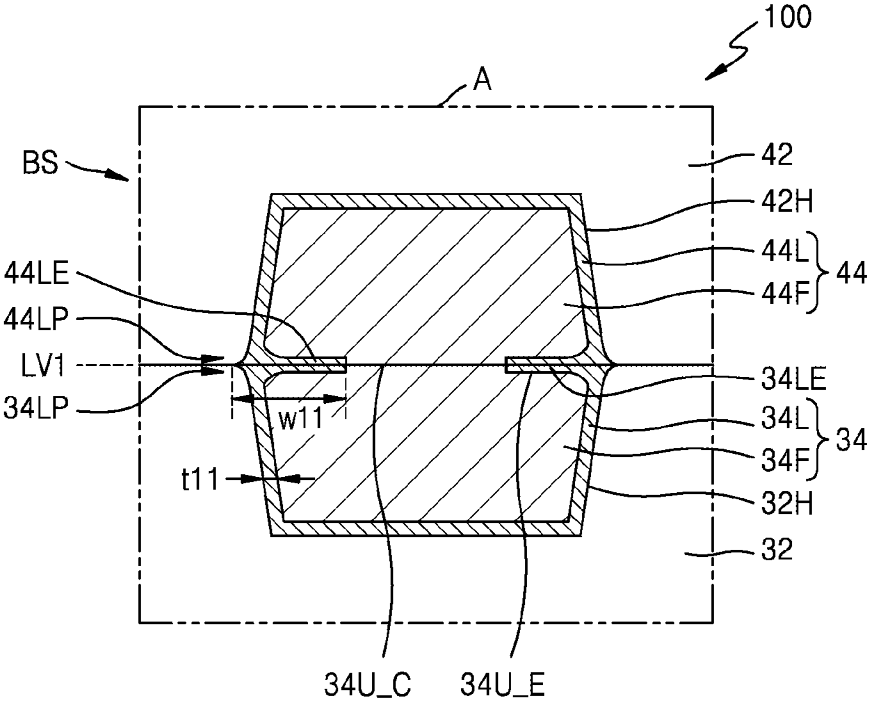

Referring to FIGS. 14 and 20, the second semiconductor chip 20 may be bonded on the first semiconductor chip 10 so that the first bonding insulating layer 32 and the second bonding insulating layer 42 are in contact with each other and the first bonding pad 34 and the second bonding pad 44 are in contact with each other (operation S160).

In some embodiments, an operation of bonding the second semiconductor chip 20 on the first semiconductor chip 10 may be performed by disposing the second semiconductor chip 20 on the first semiconductor chip 10 so that the first bonding insulating layer 32 and the second bonding insulating layer 42 are in contact with each other and the first bonding pad 34 and the second bonding pad 44 are in contact with each other, and applying heat treatment to such a structure. In embodiments, the heat treatment may be performed at a temperature of about 200° C. to about 350° C.

In some embodiments, inter-diffusion of metal atoms included in the first pad metal layer 34F and metal atoms included in the second pad metal layer 44F may occur during the heat treatment, and the first pad metal layer 34F and the second pad metal layer 44F may be bonded to each other. During the heat treatment, the upper surface of the first bonding insulating layer 32 and the upper surface of the second bonding insulating layer 42 may be bonded to each other, and a metal-oxide hybrid bonding may occur.

In some embodiments, because the horizontal extension portion 34LE of the first conductive barrier layer 34L functions as a diffusion barrier of metal atoms, and the upper surface central portion 34U_C of the first pad metal layer 34F is not covered by the horizontal extension portion 34LE of the first conductive barrier layer 34L, metal atoms (e.g., copper atoms) in the first pad metal layer 34F may diffuse or expand through the upper surface central portion 34U_C of the first pad metal layer 34F. That is, the upper surface central portion 34U_C of the first pad metal layer 34F may function as a region for bonding between the first bonding pad 34 and the second bonding pad 44.

For example, even though the volume of the first pad metal layer 34F is relatively small for a fine pitch package application, the diffusion and/or expansion of copper atoms to a relatively large height may be induced through the upper surface central portion 34U_C of the first pad metal layer 34F. Accordingly, defects in the bonding process of the first bonding pad 34 and the second bonding pad 44 may be prevented, and bonding of sufficient strength between the first bonding pad 34 and the second bonding pad 44 may be secured.

The semiconductor package 100 may be completed by the process described above.

According to the method of manufacturing the semiconductor package 100 described above, in the process of bonding the first bonding pad 34 and the second bonding pad 44, the first bonding pad 34 may expand to a relatively great height through the central portion 34U_C of the upper surface of the first pad metal layer 34F, and accordingly, bonding of sufficient strength between the first bonding pad 34 and the second bonding pad 44 may be secured. In addition, the process of forming the horizontal extension portion 34LE of the first conductive barrier layer 34L may be simultaneously performed during the planarization process of the first bonding insulating layer 32, and thus, the manufacturing cost may be reduced.

While the inventive concept has been particularly shown and described with reference to embodiments thereof, it will be understood that various changes in form and details may be made therein without departing from the scope of the following claims.

What is claimed is:

1. A semiconductor package comprising:

a first semiconductor chip comprising a first semiconductor device;

a second semiconductor chip comprising a second semiconductor device; and a bonding structure between the first semiconductor chip and the second semiconductor chip, the bonding structure comprising:

a first bonding pad electrically connected to the first semiconductor device;

a first bonding insulating layer surrounding a sidewall of the first bonding pad;

a second bonding pad electrically connected to the second semiconductor device and in contact with the first bonding pad; and a second bonding insulating layer surrounding a sidewall of the second bonding pad and in contact with the first bonding insulating layer, wherein the first bonding pad comprises:

a first pad metal layer in a first pad opening portion of the first bonding insulating layer; and a first conductive barrier layer having a first portion surrounding a sidewall and a bottom surface of the first pad metal layer and disposed between the first bonding insulating layer and the first pad metal layer, and wherein the first conductive barrier layer comprises a horizontal extension portion, having a same material as the first portion, extending on an edge of an upper surface of the first pad metal layer.

2. The semiconductor package of claim 1, wherein the horizontal extension portion of the first conductive barrier layer is continuously connected to the first conductive barrier layer on the sidewall of the first pad metal layer.

3. The semiconductor package of claim 1, wherein the horizontal extension portion of the first conductive barrier layer is on an entire edge of an upper surface of the first bonding pad.

4. The semiconductor package of claim 1, wherein an area of the horizontal extension portion of the first conductive barrier layer is 10% to 50% of an area of an upper surface of the first bonding pad.

5. The semiconductor package of claim 1, wherein:

a first portion of the first conductive barrier layer on the sidewall of the first pad metal layer has a first thickness, and the horizontal extension portion of the first conductive barrier layer has a first width, and the first width is greater than the first thickness.

6. The semiconductor package of claim 1, wherein the second bonding pad comprises:

a second pad metal layer in a second pad opening portion of the second bonding insulating layer; and a second conductive barrier layer surrounding a sidewall and a bottom surface of the second pad metal layer and disposed between the second bonding insulating layer and the second pad metal layer, wherein the second conductive barrier layer comprises a horizontal extension portion extending on an edge of an upper surface of the second pad metal layer.

7. The semiconductor package of claim 6, wherein:

the upper surface of the first pad metal layer is in contact with the upper surface of the second pad metal layer, and the horizontal extension portion of the first conductive barrier layer is in contact with the horizontal extension portion of the second conductive barrier layer.

8. The semiconductor package of claim 6, wherein the horizontal extension portion of the first conductive barrier layer does not cover a central portion of the upper surface of the first pad metal layer.

9. The semiconductor package of claim 1, wherein the first conductive barrier layer comprises a protrusion portion protruding outwardly away from a sidewall of the first pad opening portion at a position adjacent the second bonding insulating layer.

10. The semiconductor package of claim 1, wherein:

the second bonding pad comprises:

a second pad metal layer in a second pad opening portion of the second bonding insulating layer; and a second conductive barrier layer surrounding a sidewall and a bottom surface of the second pad metal layer and disposed between the second bonding insulating layer and the second pad metal layer, and the horizontal extension portion of the first conductive barrier layer is between an edge of an upper surface of the second pad metal layer and the edge of the upper surface of the first pad metal layer.

11. The semiconductor package of claim 1, wherein:

the first bonding insulating layer and the second bonding insulating layer each comprise silicon oxide, and the first conductive barrier layer comprises at least one of titanium, tantalum, titanium nitride, and tantalum nitride.

12. The semiconductor package of claim 1, further comprising: a first interfacial insulating layer and a second interfacial insulating layer between the first bonding insulating layer and the second bonding insulating layer, wherein:

an upper surface of the first interfacial insulating layer is coplanar with an upper surface of the first bonding pad, an upper surface of the second interfacial insulating layer is coplanar with an upper surface of the second bonding pad, and the upper surface of the first interfacial insulating layer is in contact with the upper surface of the second interfacial insulating layer.

13. The semiconductor package of claim 12, wherein:

the first bonding insulating layer and the second bonding insulating layer each comprise silicon oxide, and the first interfacial insulating layer and the second interfacial insulating layer each comprise silicon carbon nitride.

14. The semiconductor package of claim 12, wherein the horizontal extension portion of the first conductive barrier layer is coplanar with the first interfacial insulating layer.

15. A semiconductor package comprising:

a first semiconductor chip comprising a first semiconductor device;

a second semiconductor chip comprising a second semiconductor device; and a bonding structure between the first semiconductor chip and the second semiconductor chip, the bonding structure comprising:

a first bonding insulating layer on the first semiconductor chip;

a first bonding pad in a first pad opening portion of the first bonding insulating layer and comprising a first conductive barrier layer and a first pad metal layer;

a second bonding insulating layer on the first semiconductor chip and in contact with the first bonding insulating layer; and a second bonding pad in a second pad opening portion of the second bonding insulating layer and comprising a second conductive barrier layer and a second pad metal layer, wherein an upper surface of the second pad metal layer is in contact with an upper surface of the first pad metal layer, wherein a portion of the first conductive barrier layer is in contact with the second conductive barrier layer on an outer edge of the upper surface of the first pad metal layer.

16. The semiconductor package of claim 15, wherein:

the first conductive barrier layer comprises a horizontal extension portion extending on the outer edge of the upper surface of the first pad metal layer, and the horizontal extension portion of the first conductive barrier layer is continuously connected to a first portion of the first conductive barrier layer on a sidewall of the first pad metal layer.

17. The semiconductor package of claim 16, wherein an area of the horizontal extension portion of the first conductive barrier layer is 10% to 50% of an area of an upper surface of the first bonding pad.

18. The semiconductor package of claim 16, wherein:

a first portion of the first conductive barrier layer on the sidewall of the first pad metal layer has a first thickness, and the horizontal extension portion of the first conductive barrier layer has a first width, and the first width is greater than the first thickness.

19. A semiconductor package comprising:

a first semiconductor chip comprising a first semiconductor device and a plurality of through electrodes;

a second semiconductor chip comprising a second semiconductor device;

a bonding structure between the first semiconductor chip and the second semiconductor chip, the bonding structure comprising:

a first bonding insulating layer on the first semiconductor chip;

a first bonding pad in a first pad opening portion of the first bonding insulating layer and comprising a first conductive barrier layer and a first pad metal layer;

a second bonding insulating layer on the first semiconductor chip and in contact with the first bonding insulating layer; and a second bonding pad in a second pad opening portion of the second bonding insulating layer and comprising a second conductive barrier layer and a second pad metal layer, wherein an upper surface of the second pad metal layer is in contact with an upper surface of the first pad metal layer, and a part of the first conductive barrier layer is in contact with the second conductive barrier layer on an edge of the upper surface of the first pad metal layer;

a molding layer surrounding a side surface of the first semiconductor chip; and a connection pillar penetrating the molding layer and electrically connected to the second semiconductor chip.

20. The semiconductor package of claim 19, wherein:

the first semiconductor chip has a first width in a first direction parallel to an upper surface of the first semiconductor chip, and the second semiconductor chip has a second width greater than the first width in the first direction.

* * * * *